US012678732B2

(12) United States Patent　　　(10) Patent No.:　US 12,678,732 B2
Braun et al.　　　　　　　　　　　　(45) Date of Patent:　　　Jul. 14, 2026

(54) MEMBRANE-DEHUMIDIFICATION TECHNOLOGIES FOR ELECTRONIC COMPONENT PROTECTION

(71) Applicant: Purdue Research Foundation, West Lafayette, IN (US)

(72) Inventors: James Edward Braun, West Lafayette, IN (US); David Elan Martin Warsinger, Carmel, IN (US); Songhao Wu, West Lafayette, IN (US); Andrew J Fix, Ballwin, MO (US)

(73) Assignee: Purdue Research Foundation, West Lafayette, IN (US)

( * ) Notice: Subject to any disclaimer, the term of this patent is extended or adjusted under 35 U.S.C. 154(b) by 361 days.

(21) Appl. No.: 18/394,223

(22) Filed: Dec. 22, 2023

(65) Prior Publication Data

US 2024/0216856 A1　　Jul. 4, 2024

Related U.S. Application Data

(60) Provisional application No. 63/435,803, filed on Dec. 28, 2022.

(51) Int. Cl.
| | |
|---|---|
| *B01D 53/26* | (2006.01) |
| *B01D 53/04* | (2006.01) |
| *B01D 53/22* | (2006.01) |
| *B01D 53/30* | (2006.01) |
| *B01D 71/02* | (2006.01) |
| *B01D 71/52* | (2006.01) |
| *B01D 71/56* | (2006.01) |
| *B01D 71/80* | (2006.01) |
| *H05K 5/02* | (2006.01) |

(52) U.S. Cl.
CPC ....... *B01D 53/268* (2013.01); *B01D 53/0438* (2013.01); *B01D 53/228* (2013.01); *B01D 53/261* (2013.01); *B01D 53/30* (2013.01); *B01D 71/024* (2013.01); *B01D 71/521* (2022.08); *B01D 71/56* (2013.01); *B01D 71/80* (2013.01); *H05K 5/0212* (2022.08); *H05K 5/0215* (2022.08); *B01D 2053/221* (2013.01); *B01D 2257/80* (2013.01); *B01D 2259/40096* (2013.01)

(58) Field of Classification Search
CPC .................................................. B01D 53/268
See application file for complete search history.

(56) References Cited

FOREIGN PATENT DOCUMENTS

EP　　　　　0825810 A1 *　2/1998　.......... H05K 5/0213

* cited by examiner

*Primary Examiner* — Robert A Hopkins
(74) *Attorney, Agent, or Firm* — David E. Novak; Brannon Sowers & Cracraft PC

(57)　　　　　　　ABSTRACT

An enclosure for housing electronics, including a housing portion defining an inner volume, an aperture formed through the housing portion, and a water selective membrane operationally connected to the aperture and positioned to selectively pass water molecules from the inner volume to an oppositely disposed exterior environment to maintain dried air within the inner volume. The enclosure of may further include an electronics package disposed within the inner volume, a Joule heater disposed within the inner volume, a pump operationally connected to the inner volume to urge water molecules across the membrane, a sensor operationally connected to the inner volume, and/or a microprocessor operationally connected to the sensor, to the pump, and/or to the Joule heater.

17 Claims, 11 Drawing Sheets

80

10

Relative Humidity Control with resistance heater

Absolute Humidity Control with Sorbent

Coatings

MEMBRANE-DEHUMIDIFICATION TECHNOLOGIES FOR ELECTRONIC COMPONENT PROTECTION

CROSS-REFERENCE TO RELATED APPLICATIONS

This patent application claims priority to U.S. provisional patent application Ser. No. 63/435,803, filed on Dec. 28, 2022, and incorporates the same by reference in its entirety.

TECHNICAL FIELD

The present novel technology relates generally to the field of electronic packaging, and, more particularly, to energy efficient dehumidification and drying processes using water selective membranes to maintain electronics in a dry enclosure.

BACKGROUND

Handling humidity in electronics and sensors is a major issue for ensuring reliable, long-lasting devices. As humidity seeps into electronic enclosures and ambient temperatures fluctuate through the day, condensation becomes a risk. This condensation could lead to corrosion of key components as well as short circuiting, both of which are quite detrimental. Currently, many sensitive electronics employ simple moisture heating devices to ensure that condensation cannot occur. This solution can be costly and does not actually address the underlying issue of humidity being present within an electronic enclosure. Thus, there remains a need for efficiently and cost-effectively maintaining a dry enclosure for electronics. The present novel technology addresses this need.

SUMMARY

Water vapor-selective membranes, which allow water vapor to pass therethrough while blocking the passage of air, have recently emerged as a high-efficiency alternative method for air dehumidification in HVAC systems, with substantial potential for energy savings in the range of 50-60%. These same membrane technologies can be incorporated into electronics enclosures to provide dehumidification for protecting against condensation as well. The present novel technology relates to a sensor enclosure method and apparatus that uses membranes to provide active dehumidification to the space where the electronics components are located. In one embodiment, a compressor/pump is used to induce the dehumidification driving force; in another embodiment, a novel Joule heating design is used.

DETAILED DESCRIPTION

Figure 1:
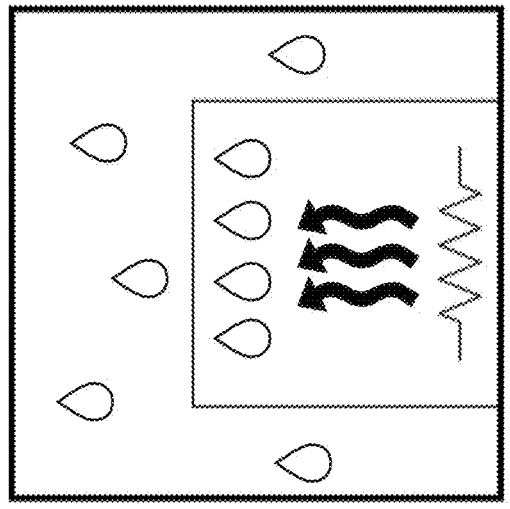
FIG. 1 schematically represents the three known PRIOR ART enclosure dehumidification techniques.
Figure 1:
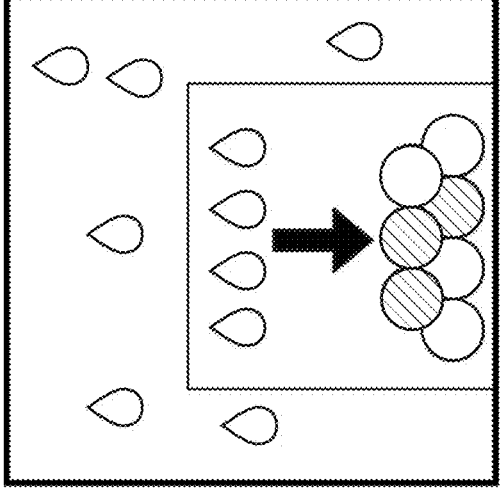
Figure 1:
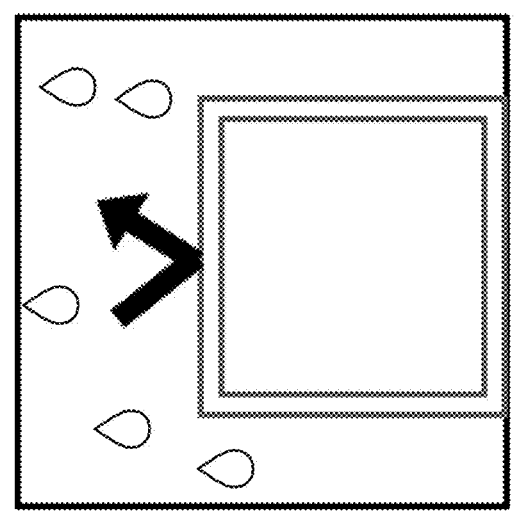
Figure 1:
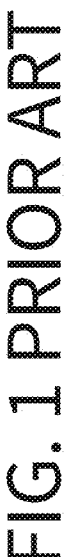

Before the present methods, implementations, and systems are disclosed and described, it is to be understood that this invention is not limited to specific synthetic methods, specific components, implementation, or to particular compositions, and as such may, of course, vary. It is also to be understood that the terminology used herein is for the purpose of describing particular implementations only and is not intended to be limiting.

As used in the specification and the claims, the singular forms "a," "an" and "the" include plural referents unless the context clearly dictates otherwise. Ranges may be expressed in ways including from "about" one particular value, and/or to "about" another particular value. When such a range is expressed, another implementation may include from the one particular value and/or to the other particular value. Similarly, when values are expressed as approximations, for example by use of the antecedent "about," it will be understood that the particular value forms another implementation. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not. Similarly, "typical" or "typically" means that the subsequently described event or circumstance often though may not occur, and that the description includes instances where said event or circumstance occurs and instances where it does not.

Drawing FIGS. 1-9 relate to embodiments of the present novel technology. The first embodiment makes use of a straightforward membrane dehumidification design wherein a compressor/pump is used to impose decreased pressure on the external environment facing side of a membrane positioned in pneumatic communication with an electronics housing or enclosure and with the surrounding external environment; such a membrane provides a substantially airtight enclosure. This low-pressure region leads to a trans-membrane water vapor partial pressure gradient, and thus water vapor is urged to migrate out of the enclosure across the water vapor-selective membrane. A heating device is optionally included positioned with the enclosure to promote natural convection to optimize humidity mass transfer at the membrane.

In a second embodiment, thermally conductive membrane support materials are used along with localized heating at the membrane interface. This "Joule heating" would induce a localized increase in water vapor pressure (as expressed by the ideal gas law) within the enclosure to induce water vapor transport across the membrane and out of the enclosure. Such a design has been used frequently in membrane distillation applications but has never been explored for dehumidification applications. This design has the benefit of being compact and standalone—including a pump or fan for the first embodiment can be costly on a large scale, but simple resistive heating elements used in the Joule pumping variant would not be.

One benefit of these above-discussed embodiments is that they can be operated cyclically and upon demand and thus are energy efficient. Dehumidification only occurs when humidity and/or temperature within the enclosure reaches a predetermined, potentially dangerous level. Once the enclosure has been sufficiently dehumidified, the device may be automatically shut off and no more energy is consumed until humidity/temperature levels once again reach predetermined, concerning levels. This approach is both energy efficient and addresses the underlying issue at hand, that of variable humidity in the air.

The prior art focusses on the following humidity control paradigms:

Relative Humidity Control: The entire temperature of the enclosure is raised, or specific surfaces are heated to ensure that the relative humidity near surfaces cannot reach 100% and condense. While this method is effective and the most common, it is very inefficient and potentially damaging to the electronic components.

Absolute Humidity Control: Some form of a desiccant is used to adsorb water vapor out of the air to keep the absolute humidity content, and thus the relative humidity, low. However, these desiccants are either non-reusable or require energy expensive regeneration.

Coatings: The third option is to coat all sensitive surfaces with a protective layer. However, this does not actually affect the enclosure humidity and is never perfect. It simply delays the process of humidity damage.

Another interesting prior art concept is GORE protective plugs. These plugs are small, screw-in plugs with a PTFE membrane which allows electronic enclosures to equilibrate as internal pressures vary. The =FE lets gases pass in and out, but blocks liquid water. So, while helpful, such plugs cannot be used to actively remove water vapor from the air.

The two primary modeling efforts presented in prior published works focused on either humidity ingress or simulating the electronic enclosure "environment." While some of the works presented numerical simulations based on mass balances, others presented detailed CFD analyses. The uncovered prior art publications had three central pitfalls: (1) they were often highly application specific, making it difficult to generalize the results, (2) the analysis was often complex and specific to a commercial CFD program, making it difficult to incorporate into a broader framework, and (3) they were not focused on humidity removal, just predicting the humidity ingress or enclosure conditions. Thus, there remains a need for a straightforward, generalized modeling framework for understanding active humidity removal from an enclosure via a selective membrane.

Generally, "dense" membranes are employed for dehumidification. In a dense membrane, water has to absorb into and diffuse through the material. This differs from porous membranes where the water vapor diffuses through air within the pores. Generally, these dense membranes combine a polymer with some other material to form "mixed-matrix" membranes where each material provides an added benefit. For example, in the membranes primarily used herein, we combined the polymer polyether block amide resin thermoplastic elastomer with graphene oxide. The polyether block amide resin thermoplastic elastomer is hydrophilic/hygroscopic and therefore enables water vapor diffusion, while the graphene oxide helps block other gasses, such as air, from transporting through the membrane. Table 1 summarizes some of the top performing selective membrane materials for dehumidification.

TABLE 1

| Abbreviated summary of top water vapor selective membranes in the literature | | | |
|---|---|---|---|
| Support Material | Selective Material | Expected H$_2$O Permeance (GPU) | Expected selectivity |
| Wire Mesh | PVA + TEG | 1,000-4800 | 3,000 |
| PAN Membrane | Pebax 1657 + GO | 1,000-5,000 | 20,000-80,000 |
| N/A (Freestanding) | Graphene Oxide | 3,000 | 10,000 |
| Nickel Support | NaA Zeolite | 2,000 | 300* |
| N/A (Freestanding) | Pebax 1074 | 850 | 200,000 |
| PAN | Cellulose Acetate | 4,000 | 11,000 |

Figure 2B:
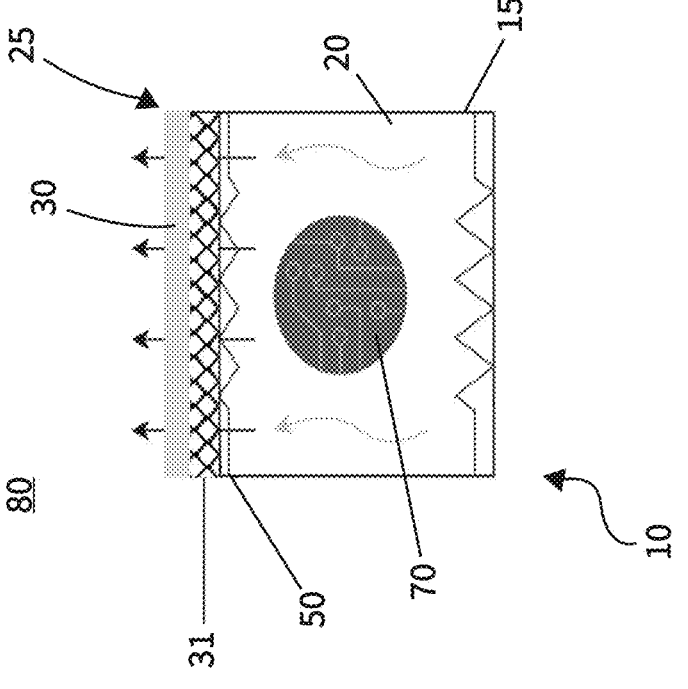
FIG. 2B schematically illustrates a second embodiment Joule-heater assisted water-vapor selective membrane enclosure dehumidification assembly of the present novel technology.
Figure 2A:
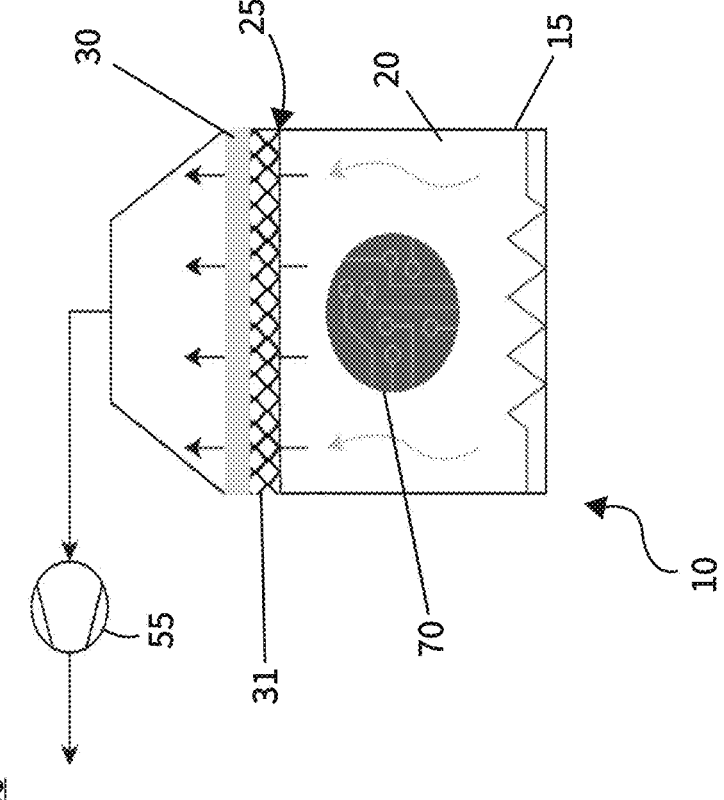
FIG. 2A schematically illustrates a first embodiment vacuum-pump assisted water-vapor selective membrane enclosure dehumidification assembly of the present novel technology.

To the best of our knowledge, it appears that no other researchers have investigated the use of Joule heating for membrane-based gas separations before. In the membrane distillation application, the membrane is heated so that the water right at the membrane interface is heated, producing vapor to be removed across the membrane. This can enhance performance by negating certain inefficiencies associated with temperature polarization and water preheating requirements. FIG. 2B shows an example concept using PV-powered Joule heating for membrane distillation.

Joule heating is traditionally used to produce vapor which is then removed via some other driving force (e.g., using vacuum in the example above). However, in applying the instant novel technology, it is recognized that vapor already exists inside the enclosure housing the electronic package. So, we are instead using membrane heating to induce a localized increase in water vapor partial pressure (without necessarily heating the entire enclosure volume) to enable selective humidity removal by the membrane. In some embodiments, the membrane is thermally conductive, while in other embodiments the membrane is thermally insulative to make use of the membrane as a near blackbody emitter allowing the Joule heater to heat the membrane, which then efficiently radiates heat into the volume to be dehumidified. In still other embodiments, the heater is part of the membrane itself.

Figure 3:
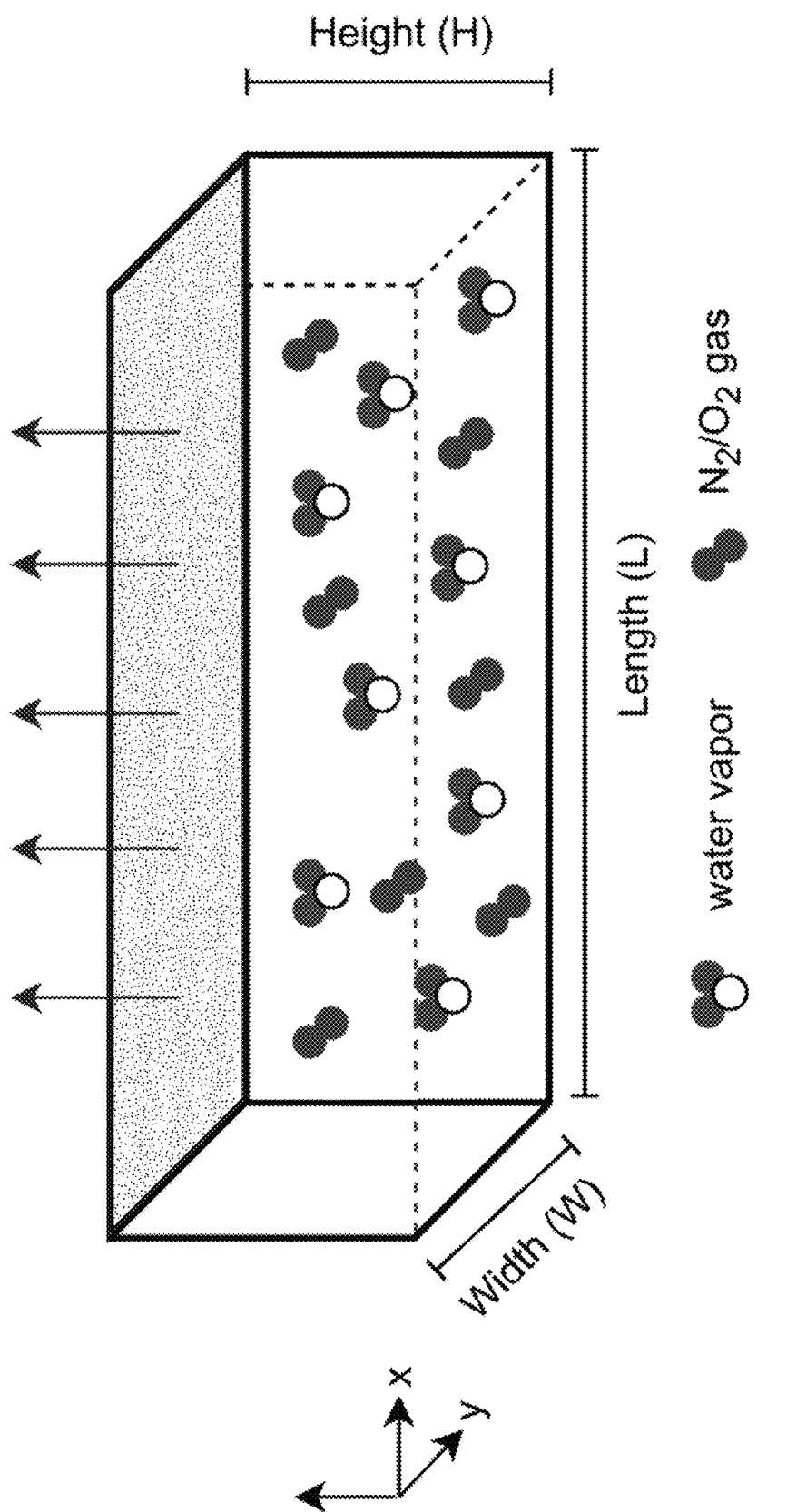
FIG. 3 schematically illustrates an enclosure sealed with a water-selective membrane.
Figure 4:
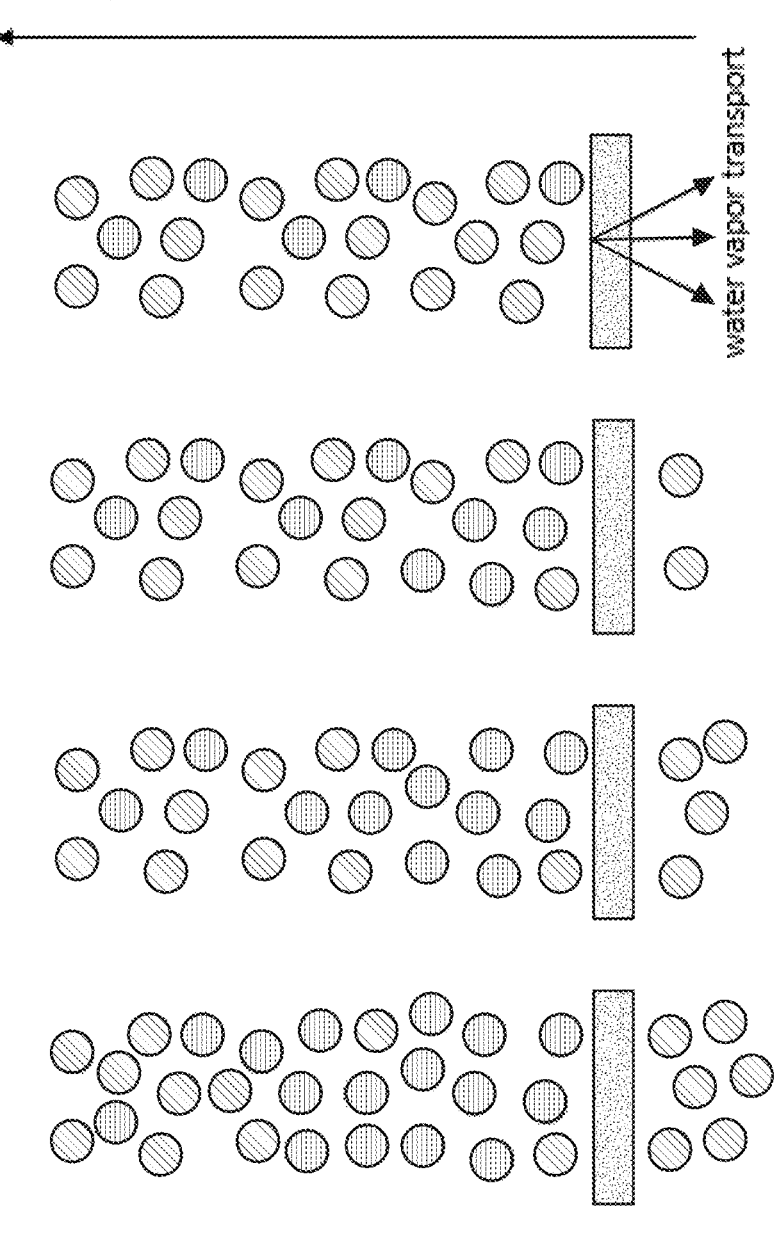
FIG. 4 graphically depicts water vapor transport from the enclosure as a function of time.

FIG. 3 shows a representation of the control volume being analyzed, in this case a generalized representation of an electronics enclosure with humidity inside and a membrane on a predetermined (in this example, the top) surface. If we conduct a simple mass balance on this control volume, we can use the following differential equation:

$$V_e \frac{dH_a}{dt} = \dot{m}_{in} - \dot{m}_{membrane} \qquad \text{Eq. 1}$$

Here, $V_e$ is the volume of the enclosure, $H_a$ is the absolute humidity, $\dot{m}_{in}$ is the mass flowrate of humidity into the enclosure, and $\dot{m}_{membrane}$ is the mass flowrate of humidity removed from the enclosure by the membrane. For the first phase of modeling, we assume that $\dot{m}_{in}$ is significantly smaller than $\dot{m}_{membrane}$ for a well-sealed enclosure, and we therefore omit it from the analysis. Next, we can define $\dot{m}_{membrane}$ according to Eq. 2.

$$\dot{m}_{membrane} = \beta A_m(p_{vap,e} - P_{vap,amb}) \qquad \text{Eq. 2}$$

Here, $\beta$ is the membrane permeance to water vapor, $A_m$ is the membrane area, and $\rho_{vap}$ is the water vapor partial pressure, either inside the enclosure (e) or in the ambient environment (amb).

Converting the left-hand side of Eq. 1 to be in terms of the humidity ratio, the new simplified mass balance takes on the form of Eq. 3.

$$\rho_{air} V_e \frac{d\omega_e}{dt} = \beta A_m(p_{vap,e} - p_{vap,amb}) \qquad \text{Eq. 3}$$

Here, $\rho_{air}$ is the density of the air in the enclosure, and W, is the humidity ratio of air in the enclosure. Ultimately, we are interested in solving for the humidity ratio as a function of time, which can be done by solving this differential equation. However, first we must re-write the vapor pressure variables in terms of the humidity ratio, since $\omega$ is the variable being solved for as a function of time. We know that the humidity ratio can be generally defined according to $$\omega = 0.62198 \left( \frac{P_{vap}}{P_{atm} - P_{vap}} \right) \qquad \text{Eq. 4}$$

Thus, this equation can be re-arranged to calculate vapor pressure as a function of the humidity ratio.

$$P_{vap} = \frac{\omega P_{atm}}{\omega + 0.62198} \qquad \text{Eq. 5}$$

Thus, Eq. 3 can be re-written once more to provide a differential equation completely in terms of the humidity ratio.

$$\rho_{air} V_e \frac{d\omega_e}{dt} = \dot{m}_{in} - \beta A_m \left( \frac{P_e \omega_e}{\omega_e + 0.62198} - \frac{P_{amb} \omega_{amb}}{\omega_{amb} + 0.62198} \right) \qquad \text{Eq. 6}$$

Eq. represents the differential equation that will be solved to calculate the humidity immediately next to the membrane as a function of time. For the Joule Heating analysis, $P_e$ is increased according to the assumed temperature increase, described by Eq. 7 from the ideal gas law.

$$P_e = \frac{T_e}{T_{amb}} P_{amb} \qquad \text{Eq. 7}$$

Similarly, in the vacuum-driven analysis, $P_{amb}$ is replaced by a vacuum pressure ($P_{vac}$). This differential equation only captures the humidity removal at the membrane interface. However, we also need to account for the passive diffusion of water vapor throughout the enclosure (also referred to as the effect of concentration polarization).

Figure 5:
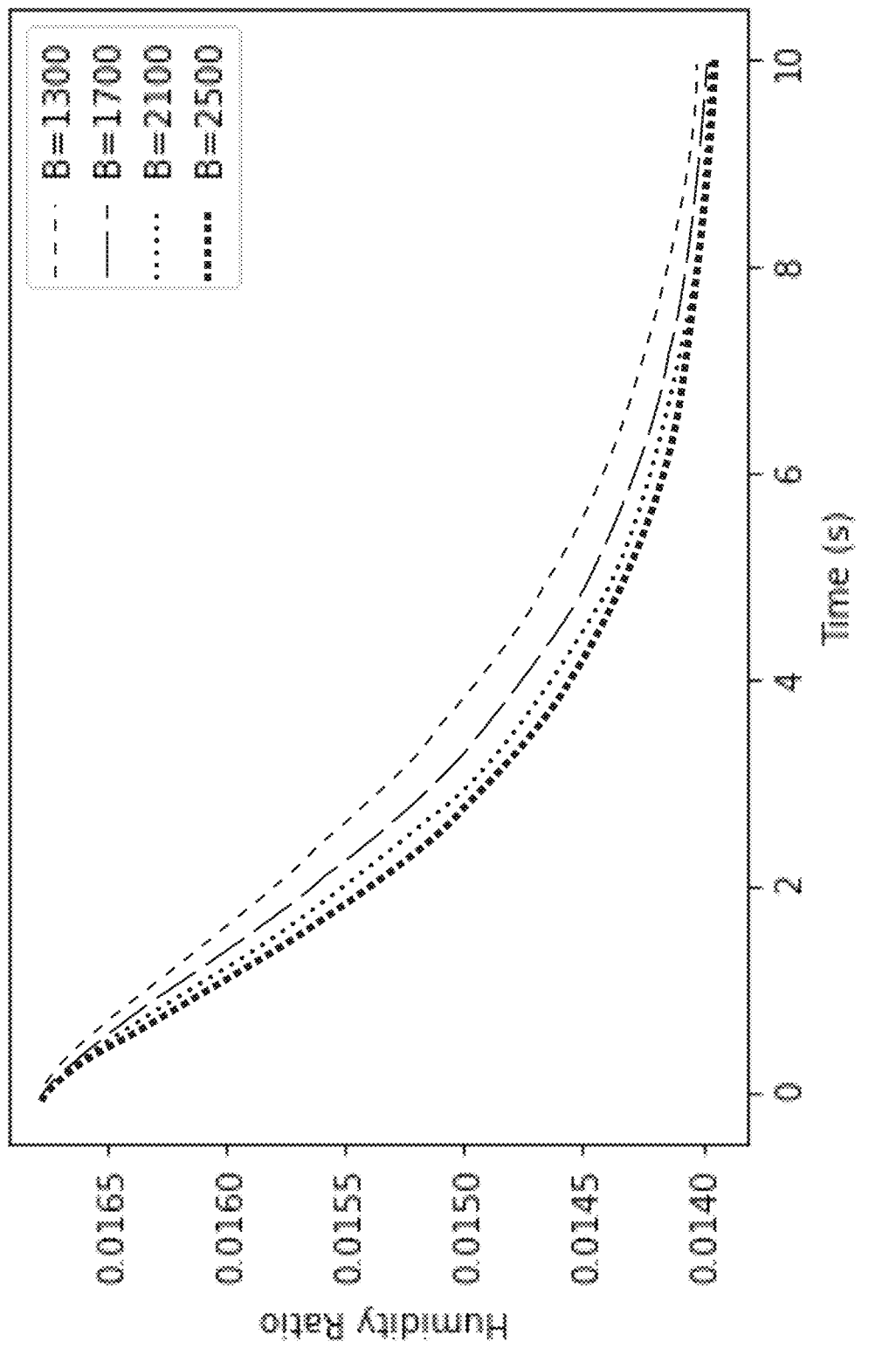
FIG. 5 is a plot of the humidity ratio inside the enclosure as a function of time for various membrane permeance values.

As mentioned above, it is helpful to account for an affect referred to as concentration polarization. Because we have a stagnant volume of air inside of the enclosure, when humidity immediately adjacent to the membrane is removed, the humidity in the rest of enclosure will migrate towards the membrane to be removed by the membrane. This tradeoff between membrane permeation and water vapor diffusion in air is a common point of analysis in related HVAC research. FIG. 5 shows a simple representation of this concentration polarization effect.

The differential equation presented in Eq. 6 is solved numerically, thus we can easily implement Fick's Law of Diffusion to account for the diffusion of water vapor throughout the volume. To achieve this, the 1D mass transfer model is discretized between the membrane surface and the opposite surface of the enclosure. Time is also discretized. A simple first-order Euler approximation scheme is applied to solve the ODE.

For any given scenario, the initial humidity conditions are known. At each time step, the humidity adjacent to the membrane (i.e. the first discrete point in space) is calculated from Eq. 6. Then, the remaining humidity values in the 1D enclosure are estimated based on Fick's Law (mass balance).

$$dm_{x=i,t=j} = \frac{D_{AB} A_m \Delta t}{\Delta x} [(A_{H,i+1,j} - A_{H,i,j}) - (A_{H,i,j} - A_{H,i-1,j})] \qquad \text{Eq. 8}$$

Here, $D_{AB}$ is the diffusion coefficient for water vapor in air, $\Delta t$ represents the time between discrete time points and $\Delta x$ represents the distance between discrete nodes between the membrane and opposite enclosure surface. Eq. 8 calculates the change in water vapor mass within each discrete element, which can then be converted to a change in absolute humidity and thus a change in humidity ratio.

With Eq. 8 and Eq. 6 nestled inside the same loops, the equations march through space and time, calculating the humidity ratio at each discrete location node at each time in the given analysis. In the end, the humidity ratio can be plotted for the enclosure and converted to dew point to present the same information in a different manner. While this explanation of the approach is brief, it should give some insight into the level of detail applied to the model.

For the purpose of showing the capability of the current model, several analyses were conducted. For now, the relevant dimensions of the enclosure are described in Table 2. Additionally, it is assumed that one of the "large" faces on the enclosure would be a selective membrane. It is assumed that the enclosure is 'leaky' and not airtight or otherwise sealed. All of the calculations and plotting may be done automatically, so if any of these dimensions are deemed unrealistic, or if we simply want to test different dimensions, the entire analysis, including plotting, can be re-done in a matter of minutes.

TABLE 2

| Summary of the enclosure dimensions used in the following sample results. | | |
| --- | --- | --- |
| Variable | Symbol | Value |
| Width | W | 3.65 cm |
| Height | H | 2.35 cm |

TABLE 2-continued

Summary of the enclosure dimensions
used in the following sample results.

| Variable | Symbol | Value |
|---|---|---|
| Length | L | 5.8 cm |
| Membrane Area | $A_m$ | 21.17 cm$^2$ |
| Membrane Permeance | β | 2300 GPU |

Figure 6:
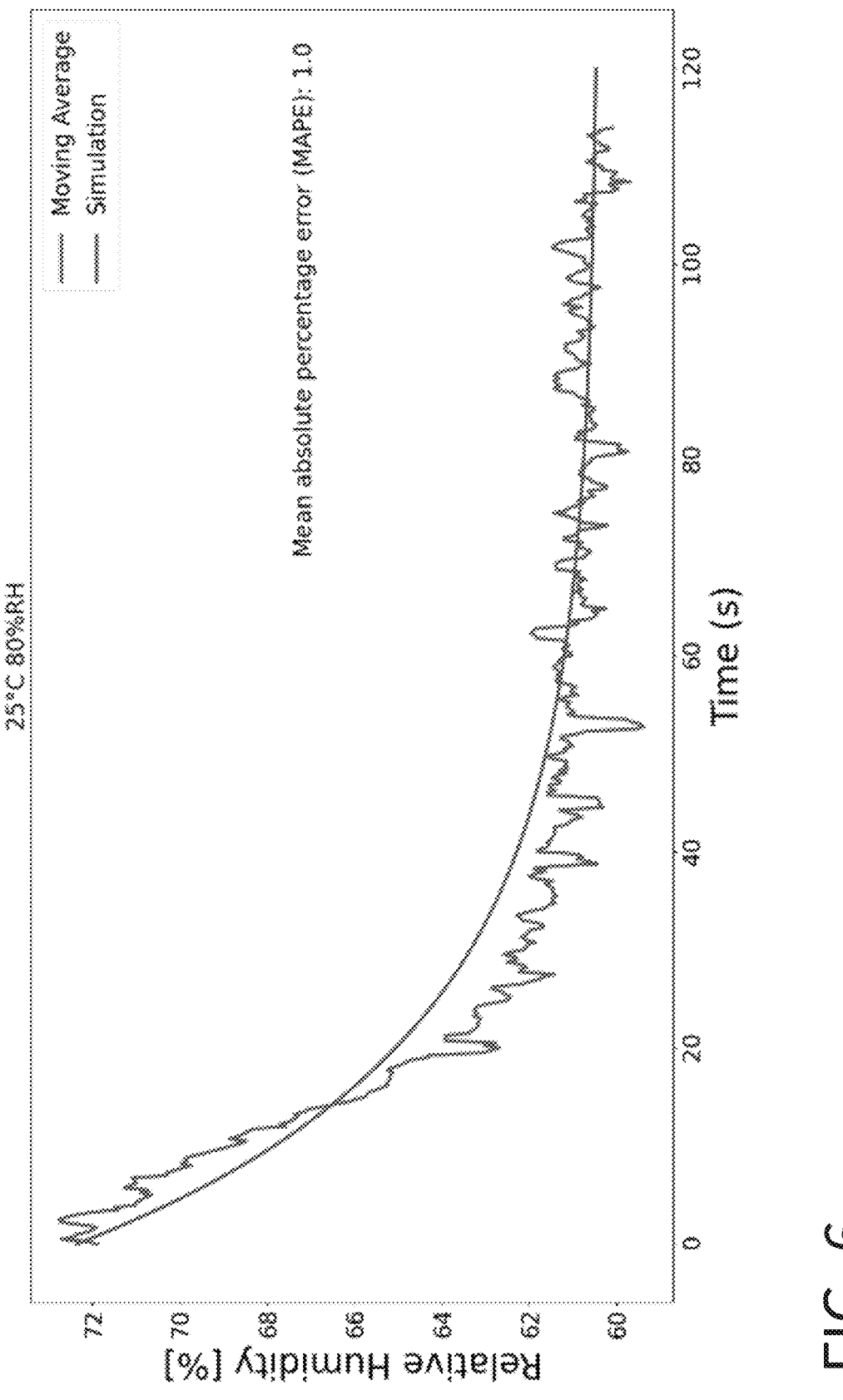
FIG. 6 graphically depicts enclosure relative humidity as a function of time.
Figure 7:
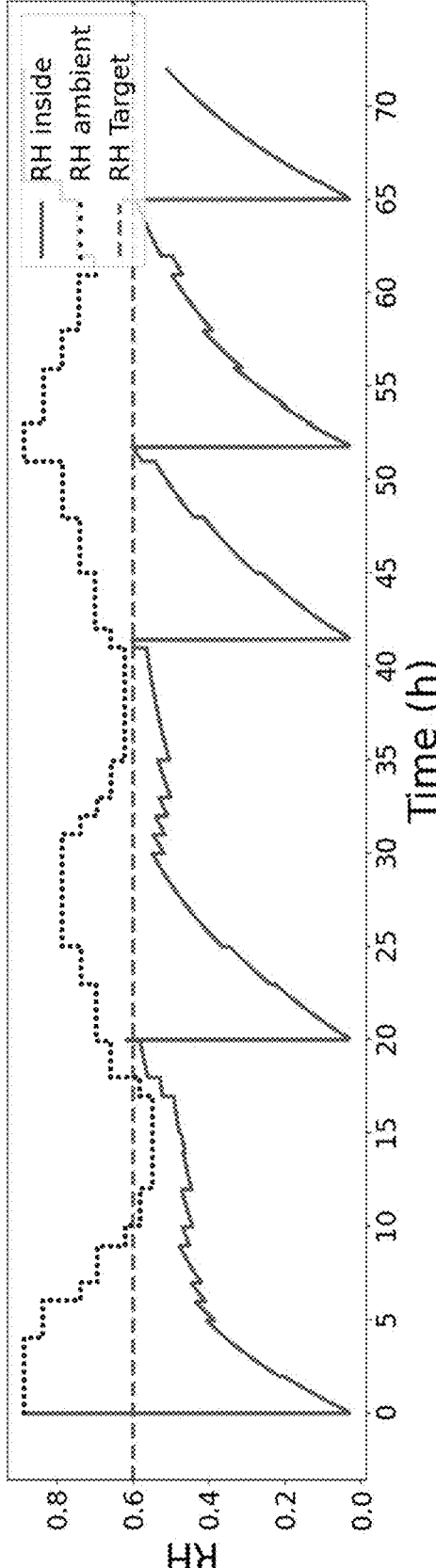
FIG. 7 graphically depicts enclosure cyclic relative humidity as a function of time for a leaky vacuum-pump assisted water-vapor selective membrane enclosure.

Next, we present some results for the vacuum-driven operation mode, as this is the more practical, near-market approach that could be easily implemented in real applications. FIG. 6 shows the types of plots that can currently be produced by the code, all of which produce some metric relating to the humidity inside the enclosure as a function of time. This plot shows the distribution of humidity in the single dimension as a function of time. So, what you notice is that at a distance of x/L=0 (which is adjacent the membrane) the humidity drops to a final value rapidly. Meanwhile, on the opposite side of the enclosure at x/L=1, the humidity drops more gradually, relying on water vapor diffusion towards the membrane surface for removal from the enclosure volume. The model can also be quickly re-run to produce comparisons between different ambient conditions.

Overall, the Joule heating portion of the code uses nearly identical code, with the major difference being that now the pressure inside the enclosure is elevated due to the increased temperature. It should be noted that currently localized heating is not specifically accounted for. In other words, an enclosure temperature is set, and it is assumed the entire enclosure volume is quickly heated to that temperature. This allows a simple analysis on the concept of heating the volume to produce the required pressure gradient, giving insight into what temperatures might be required and what kind of humidity reduction is ultimately achievable. Of course, when adding even more detail, we can account for heating convection (which will delay the time to remove humidity and could induce convective air currents to help mix the volume and reduce the effect of concentration polarization). This level of detail could be useful, though it is approaching the limits of a simple numerical framework and could require commercial simulations using a program. Either way, this portion of the code can produce the same type of results as the vacuum-driven operation code, so an abbreviated sample of results are shown below.

Some interesting takeaways from these sample plots is that raising the temperature of the enclosure to approximately 128° C. will yield similar humidity reduction. What we have to consider is which scenario proves more energy efficient—pulling an 80 kPa absolute pressure vacuum (i.e., 20 kPa below atmosphere) or heating the enclosure to 128° C. Dealing with such high temperatures could be damaging to the membranes or to the electronics. If high temperature operation is not a concern, this Joule heating approach could still be beneficial due to the small scale and simplicity of using a resistive heating element compared to requiring a dedicated pump or fan to pull a negative pressure. Likely, both operational modes will have unique applications where they are more favorable, which is why it is important to consider both options and/or a hybrid of the two.

The primary performance metric of the preliminary experiments explores the humidity ratio or dew point temperature versus time, much like the results in the modeling section of this document. We want to understand how quickly the humidity level is reduced inside the control volume, and how the vacuum levels or elevated volume temperatures impact the speed of dehumidification and final humidity. To monitor these parameters, several components/sensors shown in Table 3 are used to control the device and acquire data.

TABLE 3

Summary of major components required for the test bench.

| Device | Manufacturer | Range | Accuracy | Signal Type |
|---|---|---|---|---|
| Temperature/Relative Humidity (T/RH) | Dwyer | −40-60° C. 0-100% RH | 0.3° C. ±2% RH | Analog Current |
| Pressure | Omega | −15-15 PSI | 0.2% | Analog Current |
| Vacuum Pump | Welch | 2.5 kPa (abs.) | / | / |

For the first iteration, only one T/RH and pressure sensor was placed inside the embodiment so the average temperature, relative humidity and pressure inside the module can be measured. Due to the small size of the device, we cannot accommodate measurements at numerous locations inside the box since the humidity sensor is large relative to the size of the prototype. We consider including an option for varying the location of humidity/temperature measurement to gain an understanding of the humidity at different points during dehumidification.

Figure 8:
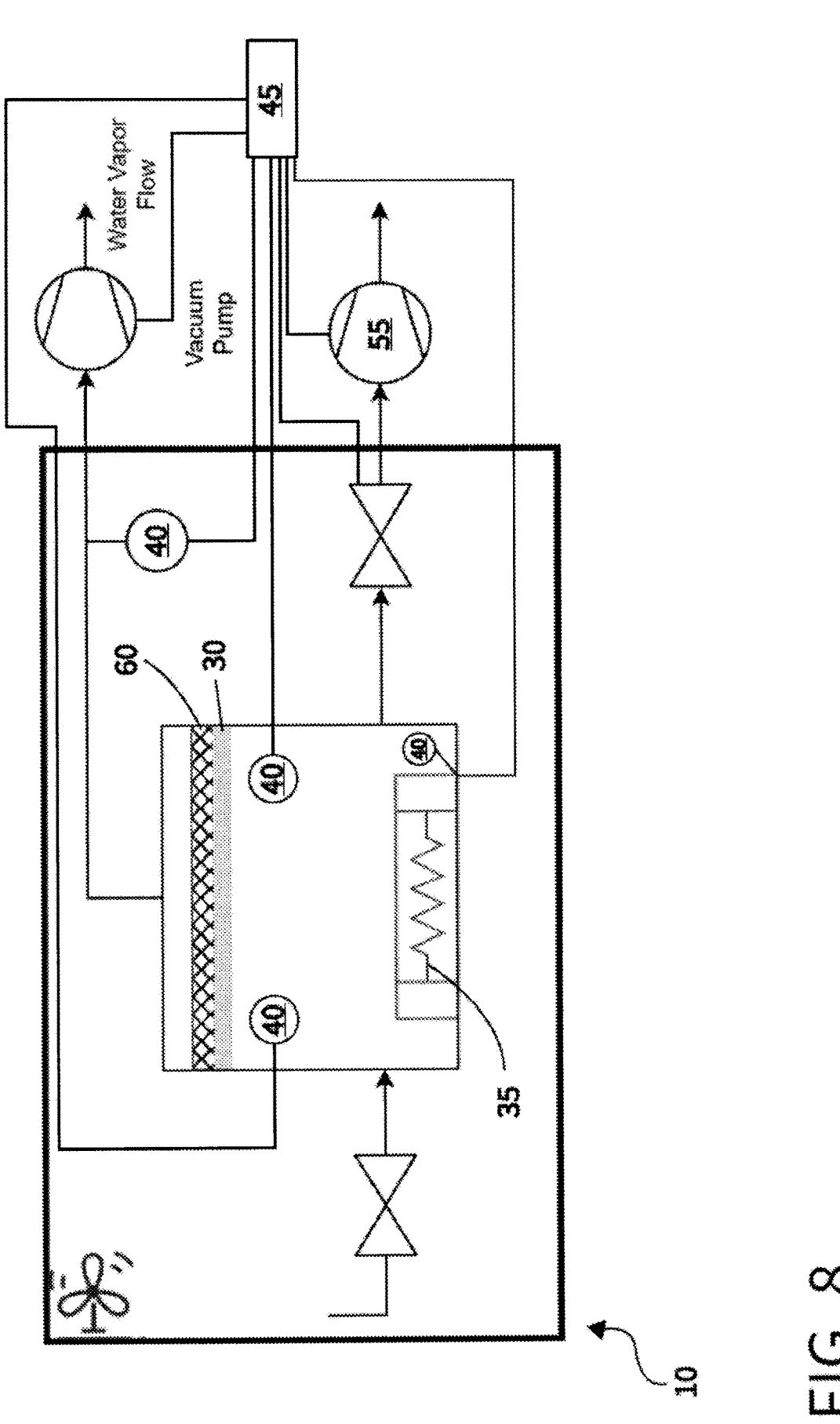
FIG. 8 schematically illustrates an enclosure embodiment combining the vacuum-pump assisted water-vapor selective membrane enclosure with the Joule heater configuration.

FIG. 8 illustrates the vacuum-driven design. The entire embodiment was placed inside of an environmental control chamber located in our Birck Nanotechnology Center laboratory. This chamber allowed us to control the temperature and humidity of the air surrounding the embodiment with great precision, emulating different outdoor conditions. A pump was used to draw air into the embodiment to ensure that the inside of the device is at the same temperature and humidity as the surrounding air in the control chamber. Then, the internal volume of the device was shut off from the surroundings via valves. The vacuum pump is energized and we were able to record the humidity inside the embodiment as the vacuum draws water vapor across the selective membrane. We also conducted experiments to measure the passive ingress of the water vapor back into the device after dehumidification.

Figure 9:
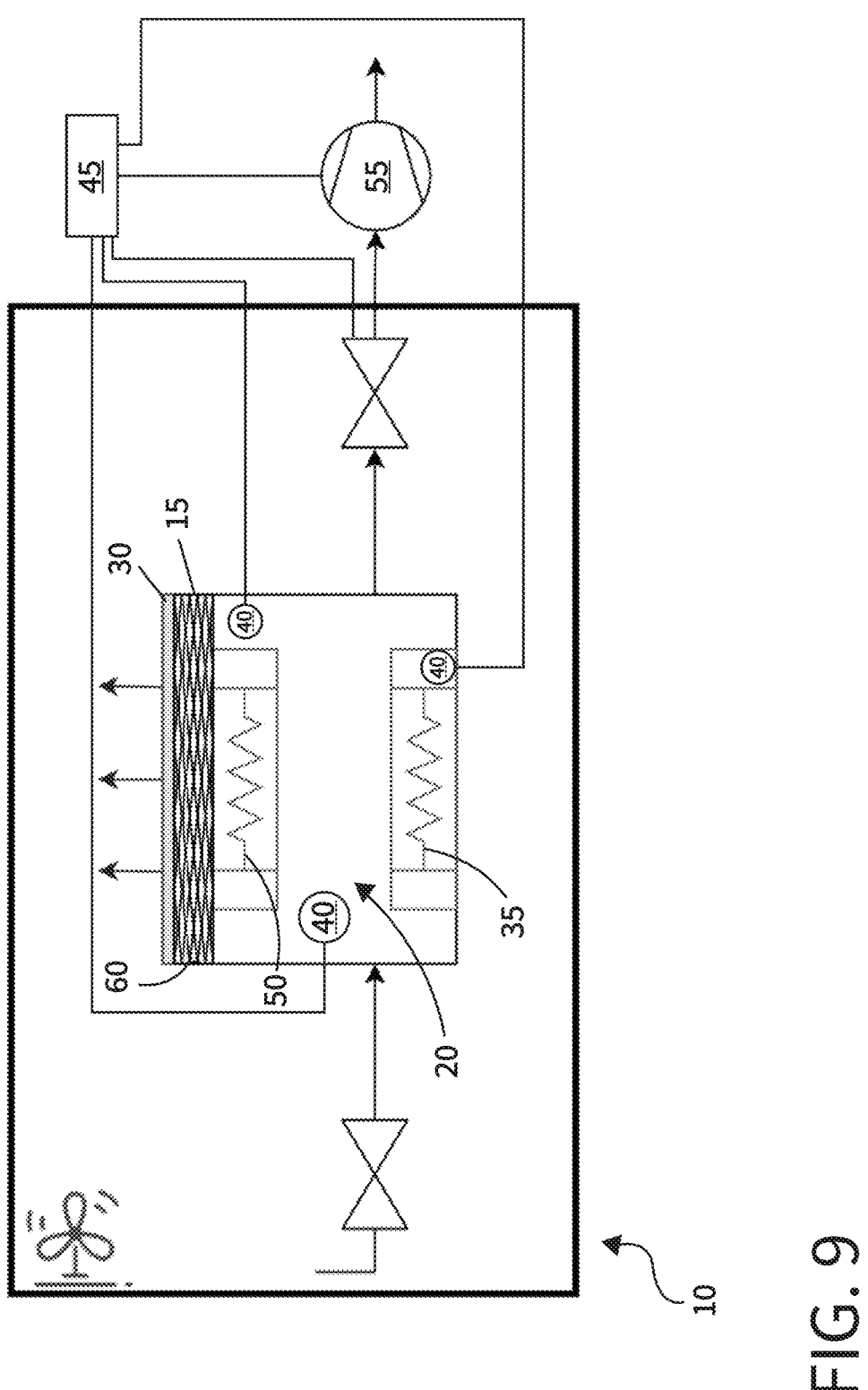
FIG. 9 schematically illustrates an enclosure embodiment combining the vacuum-pump assisted water-vapor selective membrane enclosure with a dual Joule heater configuration.
Figure 10:
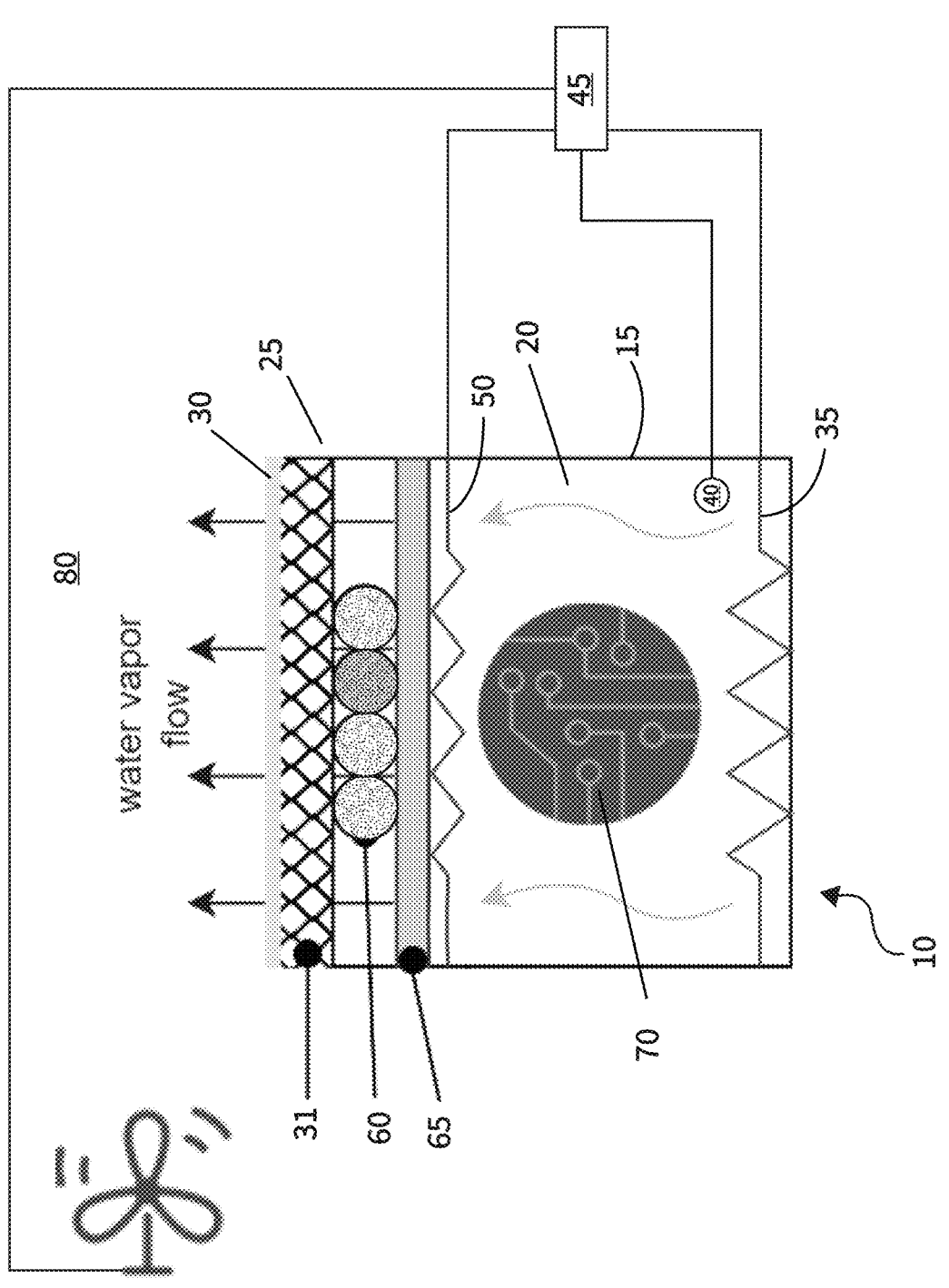
FIG. 10 schematically illustrates a third embodiment resistance-heater assisted water-vapor selective membrane enclosure having a desiccant positioned near the membrane dehumidification assembly of the present novel technology.
Figure 11:
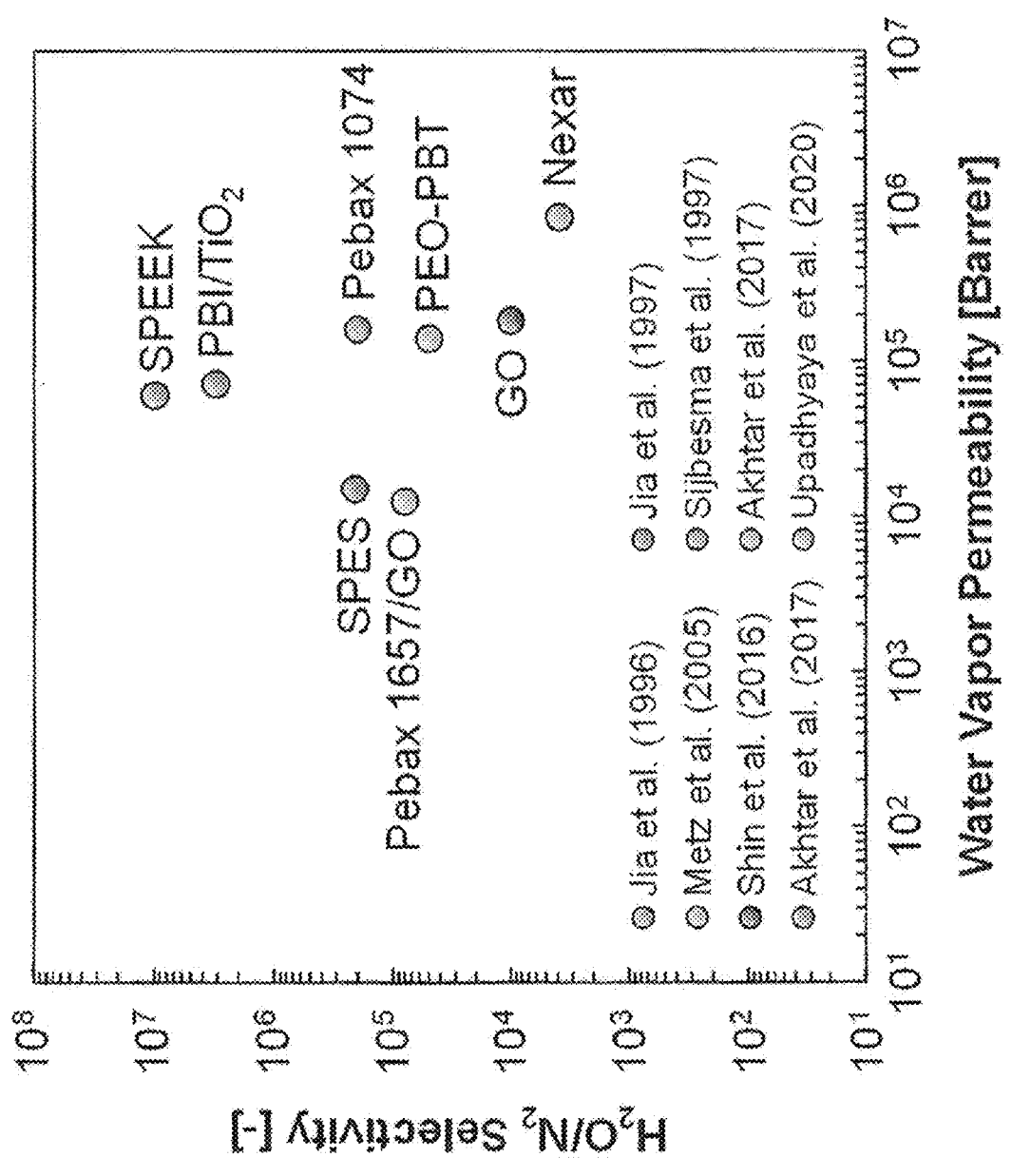
FIG. 11 graphically illustrates water vapor permeability as a function of water and nitrogen selectivity.

FIG. 9 depicts the joule heating design schematic. The general procedure for running a test was nearly identical to that described above, but for instead of energizing a vacuum pump to draw water vapor across the membranes a resistive heating element was energized to raise the temperature (and thus pressure) inside the device to push water vapor across the membrane. A sensor, such as a temperature sensor, was positioned adjacent the Joule heater and an electronic controller was operationally connected to the sensor and to the Joule heater. While the vacuum-driven design responded quickly once the pump was energized, the Joule heating design takes longer to be effective since the enclosure temperatures need to increase before noticeable dehumidification occurs.

In some embodiments, the system is designed such that the same device can accommodate the simultaneous implementation of both concepts, combining the vacuum-driven and Joule heating elements into a single embodiment.

As previously mentioned, all of the experiments were conducted inside of an environmental control chamber for highly stable control of the constant temperature and humidity. The environmental chamber has sealable ports wires and tubing in and out of the chamber, while still isolating the inside of the chamber for the lab space. We can evaluate whether or not the sealing plugs can effectively seal around the tubes that will run to the vacuum pump and the downstream pump used to draw air into the device, but this should be simple to work around. We built off of our extensive experience testing membrane dehumidification systems for HVAC applications. There are three interesting variables which impact the performance of this system: temperature, humidity, and pressure. In the following sub-sections, we break down some of the testing conditions.

For the vacuum-driven operation, the primary variable of interest is the vacuum pressure. We conducted tests at the following approximate "ambient" conditions:

| | | |
|---|---|---|
| 25° C., 20% RH | 30° C., 20% RH | 35° C., 20% RH |
| 40° C., 20% RH | | |
| 25° C., 40% RH | 30° C., 40% RH | 35° C., 40% RH |
| 40° C., 40% RH | | |
| 25° C., 60% RH | 30° C., 60% RH | 35° C., 20% RH |
| 25° C., 80% RH | | |

This range of temperature and humidity was chosen as a general representation of the ranges we are interested in. For each ambient test point, we will record the humidity inside of the embodiment versus time, for varying vacuum levels, ranging from absolute vacuum pressures between 3-80 kPa. The vacuum pump we used allows approximate control of the vacuum level.

With these data points, we extract a number of different trends:

Impact of absolute humidity of the dehumidification effectiveness and speed

Impact of ambient temperature on dehumidification effectiveness and speed

Vacuum pressure effect on dehumidification effectiveness and lowest attainable dew point temperature.

From these tests, we identify the vacuum pressure requirements and limitations under varying ambient conditions. We consider the lowered dew point temperature (due to membrane dehumidification) and the required dew point temperature to avoid condensation as ambient temperatures drop at night—requiring some assumptions about the ambient environment. If a near-absolute vacuum is not required for safe operation, we can replace the vacuum pump with a simple fan in a real application (where the fan suction side causes the negative pressure required for to pull water vapor across the membrane).

Testing the system performance of our Joule pumping operation was conducted at a very similar set of "ambient" conditions. Now, instead of varying the vacuum pressure, which is not a variable in the Joule pumping variant, we modulate the internal temperature of the control volume. Controlling this temperature requires some sort of controllable resistive heating element. Heating tape is one option, however, the device used for this system must also fit within the tight dimensions of the enclosure.

Now, there are additional concerns that were explored as part of the Joule pumping experiments. Initially, we used membranes we fabricated made from PVDF, polyether block amide resin thermoplastic elastomer, and graphene oxide (GO). PVDF has a melting temperature of approximately 180° C., and polyether block amide resin thermoplastic elastomer has a melting temperature of approximately 240° C. So, the dehumidification performance must be maintained within these temperature limits.

Additionally, it has been shown that many of the polymeric materials used for water vapor-selective membranes exhibit a drop in water vapor permeance at higher air temperatures. This stems from a tradeoff between sorption and diffusivity for the materials. Sorption generally decreases at higher temperatures and diffusivity generally increases at higher temperature. Though in many materials the net effect is a decrease in permeance at higher temperatures. We have conducted preliminary experiments to understand the impact of temperature on the polyether block amide resin thermoplastic elastomer+GO membranes.

As can be seen, the membranes exhibit a slight decrease in permeance at higher temperatures. Now, this temperature dependence is minor compared to some other materials like PVA+TEG, but at even higher temperatures, the effect could become more pronounced. Thus, it is a factor that needs to be considered when conducting the Joule pumping experiments.

Example 1

An assembly 10 for housing electronics or the like, including a housing portion 15 defining an inner volume 20, an aperture 25 formed through the housing portion 15, and a water selective membrane 30 operationally connected to the aperture 25 and positioned to selectively pass water molecules from the inner volume 20 to an oppositely disposed exterior environment to maintain dried air within the inner volume 20. A (typically thermally conductive) membrane support member 31 may be operationally connected to the membrane 30.

Example 2

An enclosure assembly 10 for reducing humidity therein, including a housing portion 15 defining an inner volume 20, an aperture 25 formed through the housing portion 15, a water selective membrane 30 operationally connected to the aperture 25 and positioned to selectively pass water molecules from the inner volume 20 to an oppositely disposed exterior environment to maintain dried air within the inner volume 20, a first resistance heater 35 operationally connected within the inner volume 20 for promoting convection, at least one sensor 40 operationally connected to the inner volume 20, and a microprocessor 45 operationally connected to the sensor(s) 40 and to the first resistance heater 35. A (typically thermally conductive) membrane support member 31 may be operationally connected to the membrane 30. The sensor(s) 40 may measure pressure, water vapor partial pressure/humidity, temperature, heating element voltage and/or power, and the like.

Example 3

An enclosure system 10 for reducing humidity therein, including a housing portion 15 defining an inner volume 20, an aperture 25 formed through the housing portion 15, a water selective membrane 30 operationally connected to the aperture 25 and positioned to selectively pass water molecules from the inner volume 20 to an oppositely disposed exterior environment to maintain dried air within the inner volume 20. A (typically thermally conductive) membrane support member 31 may be operationally connected to the membrane 30. A resistance heater 50 is operationally connected within the inner volume 20 and positioned adjacent the membrane 30 for increasing the local water vapor partial pressure, a sensor 40 is operationally connected to the inner volume 20, a microprocessor 45 is operationally connected to the sensor 40 and to the membrane resistance heater 50, and a pump 55 is operationally connected to the microprocessor 45 and positioned in fluidic communication with the inner volume 15 to urge water molecules across the membrane 30 to the exterior environment 80.

Example 4

An enclosure system 10 for reducing humidity therein, including a housing portion 15 defining an inner volume 20, an aperture 25 formed through the housing portion 15, a water selective membrane 30 operationally connected to the aperture 25 and positioned to selectively pass water molecules from the inner volume 20 to an oppositely disposed exterior environment to maintain dried air within the inner volume 20. A (typically thermally conductive) membrane support member 31 may be operationally connected to the membrane 30. Desiccant 60 is operationally connected within the inner volume 20 and typically positioned adjacent the membrane 30. A desiccant support member 65 is operationally connected to the housing 15 for stabilizing the desiccant 60. A resistance heater 50 is operationally connected within the inner volume 20 and positioned adjacent the membrane 30 and desiccant 60 for increasing the local water vapor partial pressure, a sensor 40 is operationally connected to the inner volume 20, a microprocessor 45 is operationally connected to the sensor 40 and to the membrane resistance heater 50, and a fan 55 is optionally operationally connected to the microprocessor 45 and positioned in fluidic communication with the membrane 30 to blow 'sweep gas' or dry air over the membrane 30 to urge water molecules across the membrane 30 to the exterior environment 80.

The presence of the desiccant 60 allows for water adsorption near the membrane, adding another mechanism for humidity removal in the enclosure 15i; positioning the desiccant 60 near the membrane 30 and heater 50 allows for 'recharging' of the desiccant 60 (i.e., removal of adsorbed water) whenever the heater 50 is energized to provide a high concentration of water near the membrane 30 to increase the partial pressure of water vapor adjacent the membrane 30 and thus increase the driving force to transport water vapor across the membrane 30 to the exterior environment 80.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to nigh-infinite subcombinations or variations of a subcombination.

What is claimed is:

1. An enclosure for housing electronics, comprising:
   a housing portion defining an inner volume;
   an aperture formed through the housing portion;
   a water selective membrane operationally connected to the aperture and positioned to selectively pass water molecules from the inner volume to an oppositely disposed exterior environment to maintain dried air within the inner volume; and
   a pump operationally connected to the inner volume to urge water molecules across the membrane.

2. The enclosure of claim 1 and further comprising an electronics package disposed within the inner volume.

3. The enclosure of claim 1 and further comprising a Joule heater disposed within the inner volume.

4. The enclosure of claim 3 and further comprising a sensor operationally connected to the inner volume; and a microprocessor operationally connected to the sensor and to the Joule heater.

5. The enclosure of claim 1 and further comprising an electronics package disposed within the inner volume; a Joule heater disposed within the inner volume; a sensor operationally connected to the inner volume; and a microprocessor operationally connected to the sensor, to the pump, and to the Joule heater.

6. The enclosure of claim 1 wherein the water selective membrane is a polymer polyether block amide resin thermoplastic elastomer portion and a graphene oxide portion.

7. The enclosure of claim 1 wherein the inner volume is airtight.

8. The enclosure of claim 3 and further comprising a desiccant operationally connected to the inner volume and positioned adjacent the water selective membrane and the Joule heater.

9. A method of minimizing humidity in an electronics enclosure, comprising:
   a) enclosing an electronics package in an inner volume;
   b) positioning a water selective membrane between the inner volume and an exterior environment;
   c) urging water molecules from the inner volume through the water selective membrane to the exterior environment; and
   d) heating the inner volume to urge water molecules through the water selective membrane;
   wherein the water selective membrane is in pneumatic communication with the inner volume and the exterior environment; and
   wherein the water selective membrane is oriented to allow unidirectional passage of water molecules therethrough to yield dried air in the inner volume.

10. The method of claim 9 and further comprising:
   e) establishing a vapor pressure differential between the inner volume and the exterior environment to urge water molecules through the water selective membrane.

11. The method of claim 9 wherein the water selective membrane is a polymer polyether block amide resin thermoplastic elastomer portion and a graphene oxide portion.

12. An enclosure for reducing humidity therein, comprising:
   a housing portion defining an inner volume;
   an aperture formed through the housing portion;
   a water selective membrane operationally connected to the aperture and positioned to selectively pass water molecules from the inner volume to an oppositely disposed exterior environment to maintain dried air within the inner volume; and
   a first resistance heater operationally connected within the inner volume for promoting convection;
   a sensor operationally connected to the inner volume; and
   a microprocessor operationally connected to the sensor and to the first resistance heater.

13. The enclosure of claim 12 and further comprising a second resistance heater positioned adjacent the water selective membrane and operationally connected to the microprocessor.

14. The enclosure of claim 12 and further comprising a pump operationally connected to the inner volume to urge water molecules across the membrane.

15. An enclosure for reducing humidity therein, comprising:

a housing portion defining an inner volume;

an aperture formed through the housing portion;

a water selective membrane operationally connected to the aperture and positioned to selectively pass water molecules from the inner volume to an oppositely disposed exterior environment to maintain dried air within the inner volume;

a first resistance heater operationally connected within the inner volume and positioned adjacent the membrane for increasing the local water vapor partial pressure;

a sensor operationally connected to the inner volume;

a microprocessor operationally connected to the sensor and to the first resistance heater; and a pump operationally connected to the microprocessor and in fluidic communication with the inner volume to urge water molecules across the membrane.

16. An electronics housing for reducing humidity therein, comprising:

a housing portion defining an inner volume;

an aperture formed through the housing portion;

a water-selective membrane operationally connected to the aperture and positioned to selectively pass water molecules from the inner volume to an oppositely disposed exterior environment to maintain dried air within the inner volume;

a first resistance heater operationally connected within the inner volume and positioned adjacent the membrane for increasing the local water vapor partial pressure;

a sensor operationally connected to the inner volume;

a microprocessor operationally connected to the sensor and to the first resistance heater; and a desiccant operationally connected to the housing portion and in positioned adjacent the water-selective membrane and resistance heater;

wherein the desiccant is in fluidic communication with the inner volume to capture water molecules.

17. The electronics housing of claim 16 and further comprising a fan positioned to urge air across the water-selective membrane.

\*    \*    \*    \*    \*